(12) United States Patent
Kitada et al.

(10) Patent No.: US 7,855,413 B2
(45) Date of Patent: *Dec. 21, 2010

(54) DIODE WITH LOW RESISTANCE AND HIGH BREAKDOWN VOLTAGE

(75) Inventors: Mizue Kitada, Saitama (JP); Kosuke Oshima, Saitama (JP); Toru Kurosaki, Saitama (JP); Shinji Kunori, Saitama (JP); Akihiko Sugai, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 11/785,808

(22) Filed: Apr. 20, 2007

(65) Prior Publication Data

US 2007/0194364 A1 Aug. 23, 2007

Related U.S. Application Data

(62) Division of application No. 10/197,565, filed on Jul. 18, 2002, now Pat. No. 7,230,298.

(30) Foreign Application Priority Data

Aug. 30, 2001 (JP) .............................. 2001-260869

(51) Int. Cl.
*H01L 29/76* (2006.01)
(52) U.S. Cl. .................. 257/332; 257/329; 257/330
(58) Field of Classification Search .......... 257/302, 257/327–343, 401–402; 438/259, 270–271, 438/589

See application file for complete search history.

(56) References Cited

U.S. PATENT DOCUMENTS 4,219,835 A   8/1980  Van Loon et al. ............. 357/55
4,231,823 A   11/1980 Hart et al. ..................... 156/64

(Continued)

FOREIGN PATENT DOCUMENTS

DE   198 20 734 A1   11/1999

(Continued)

OTHER PUBLICATIONS

IEEE Transactions on Electron Devices, vol. 32, No. 1, Jan. 1985, pp. 2-6 (Ueda et al.), XP836740.

(Continued)

*Primary Examiner*—Ori Nadav
(74) *Attorney, Agent, or Firm*—Kratz, Quintos & Hanson, LLP

(57) ABSTRACT

A transistor and diode having a low resistance and a high breakdown voltage are provided. When the bottom portion of a narrow trench having the shape of a rectangular parallelepiped is filled with a semiconductor grown by epitaxial method, a {1 0 0} plane is exposed at the sidewalls of the narrow trench. The semiconductor is epitaxially grown at a constant rate on each sidewall of the narrow trench; thereby, creating a filling material with no voids present therein. The concentration and width of the filling material are optimized. This allows the portion located between the filling materials in a drain layer to be completely depleted when the filling material is completely depleted; thereby, making it possible to establish an electric field having a constant strength in the depletion layer extended in the drain layer.

3 Claims, 15 Drawing Sheets

U.S. PATENT DOCUMENTS

| | | | | |
|---|---|---|---|---|
| 4,982,260 | A * | 1/1991 | Chang et al. | 257/656 |
| 5,023,691 | A | 6/1991 | Hagino | 357/43 |
| 5,166,760 | A * | 11/1992 | Mori et al. | 257/260 |
| 5,216,275 | A | 6/1993 | Chen | 257/493 |
| 5,321,289 | A | 6/1994 | Baba et al. | 257/331 |
| 5,323,040 | A | 6/1994 | Baliga | 257/332 |
| 5,438,215 | A | 8/1995 | Tihanyi | 257/401 |
| 5,686,330 | A | 11/1997 | Farb et al. | 437/41 |
| 5,693,569 | A | 12/1997 | Ueno | 438/270 |
| 5,801,417 | A | 9/1998 | Tsang et al. | 257/333 |
| 5,883,411 | A | 3/1999 | Ueda et al. | 257/331 |
| 6,060,747 | A | 5/2000 | Okumura et al. | 257/331 |
| 6,150,693 | A | 11/2000 | Wollesen | 257/330 |
| 6,177,704 | B1 | 1/2001 | Suzuki et al. | 257/343 |
| 6,180,966 | B1 | 1/2001 | Kohno et al. | 257/173 |
| 6,204,097 | B1 | 3/2001 | Shen et al. | 438/133 |
| 6,252,288 | B1 * | 6/2001 | Chang | 257/471 |
| 6,261,929 | B1 | 7/2001 | Gehrke et al. | 438/478 |
| 6,384,431 | B1 | 5/2002 | Takahashi et al. | 257/147 |
| 6,404,032 | B1 * | 6/2002 | Kitada et al. | 257/471 |
| 6,815,767 | B2 | 11/2004 | Nakamura et al. | 257/330 |
| 6,847,079 | B2 | 1/2005 | Nakamura | 257/330 |
| 7,230,298 | B2 * | 6/2007 | Kitada et al. | 257/332 |
| 2001/0005031 | A1 | 6/2001 | Sakamoto et al. | 257/401 |
| 2001/0052617 | A1 | 12/2001 | Kitada et al. | 257/330 |
| 2003/0132499 | A1 | 7/2003 | Hatade et al. | 257/500 |

FOREIGN PATENT DOCUMENTS

| | | |
|---|---|---|
| EP | 1 085 577 A2 | 3/2001 |
| EP | 1 139 433 A1 | 10/2001 |
| WO | WO 00/70684 | 11/2000 |

OTHER PUBLICATIONS

European Office Action dated May 11, 2009.

* cited by examiner

DIODE WITH LOW RESISTANCE AND HIGH BREAKDOWN VOLTAGE

This application is a Divisional of prior application Ser. No. 10/197,565 filed on Jul. 18, 2002 now U.S. Pat. 7,230,298.

BACKGROUND OF THE INVENTION

1. Field of the Invention

The present invention generally relates to transistors and diodes; and more particularly, to a transistor and a diode which are constructed to have narrow trenches in which a crystal semiconductor is epitaxially grown.

2. Description of the Related Art

FIG. 20 is a cross-sectional view illustrating a conventional transistor 102.

The transistor 102, or a trench type power MOSFET, comprises a semiconductor substrate 111 in which $N^+$-type impurity is highly doped in single crystal silicon and a drain layer 112 having an epitaxial layer of $N^-$-type silicon, which is epitaxially grown on top of the semiconductor substrate 111.

A processing substrate 110 comprises the semiconductor substrate 111 and the drain layer 112, and is subjected to the process of fabricating a semiconductor device, such that a P-type body layer 113 is formed on an inner peripheral surface of the drain layer 112 on its surface side, and a plurality of $P^+$-type ohmic regions 116 and $N^+$-type source regions 130 are formed in the surface of the body layer 113.

Between the source regions 130, the surface of the semiconductor substrate 110 is etched in a straight line with predetermined width to form a narrow trench 120.

A gate insulating film 124 is formed on an inner surface of the narrow trench 120. The narrow trench 120 is filled with polysilicon without contacting the semiconductor substrate 110 due to the presence of the gate insulating film 124 therebetween. The polysilicon forms a gate electrode plug 127.

The gate electrode plugs 127 in each narrow trench 120 are connected to another via a gate electrode film (not shown) having a thin metal film.

Formed on the surfaces of the source regions 130 and the ohmic regions 116 is a source electrode film 137 having a thin metal film. Formed on the narrow trench 120 is an interlayer insulation film 131, which electrically insulates the source electrode film 137 from the gate electrode plug 127.

A drain electrode film 139 is formed on the backside of the processing substrate 110 (i.e., on the surface of the semiconductor substrate 111).

Suppose that a positive voltage equal to or greater than a threshold voltage is applied to the gate electrode film with the source electrode film 137 being made equal to a ground potential and a positive voltage being applied to the drain electrode film 139. In this case, formed at the interface between the gate insulating film 124 and the body layer 113 is an N-type inverted layer, which connects between the source region 130 and the drain layer 112 and through which current flows from the drain layer 112 toward the source region 130. This is the conduction state of the transistor 102. Since the transistor 102 has no JFET region that is usually provided for a power MOSFET having no narrow trench 120, the transistor 102 has a lower conduction resistance than a typical power MOSFET.

When the conduction state changes to a state where the potential of the gate electrode film is equal to that of the source electrode film 137, the inverted layer disappears causing no more current to flow.

In this state, the PN junction between the body layer 113 and the drain layer 112 is reverse biased; and the avalanche breakdown voltage of the P-N junction is equal to the breakdown voltage of the transistor 102.

In general, the avalanche breakdown voltage of a P-N junction depends on the shape of a depletion layer when reverse biased. Since the aforementioned transistor 102 has an electric field of nonuniform strength in the depletion layer that extends in the drain layer 112, the avalanche breakdown voltage depends on the electric field of the greatest strength; thereby, reducing the breakdown voltage.

In order to address this problem, there has been suggested a semiconductor device 103 having a structure as shown in FIG. 21, in which such an attempt has been made as to form a buried layer 122 having a different conductivity type from the drain layer 112, beneath the narrow trench 120 so as to decrease the electric field strength in the depletion layer that extends in the drain layer 112.

The buried layer 122 is formed by once digging deep the narrow trench 120 and then growing a filling material on the bottom and sidewalls in the narrow trench 120, where a single crystal or a poly-crystal semiconductor can be used as the filling material.

However, there is a drawback in not being able to obtain the breakdown voltage as expected in the case where single crystal silicon, selected as the filling material, is used to grow a silicon epitaxial layer in the narrow trench 120 to form the buried layer 122 of the epitaxial layer.

SUMMARY OF THE INVENTION

The present invention has been developed to address the aforementioned problem or drawback of the prior art. It is therefore an object of the invention to provide a semiconductor device that has a low resistance and high breakdown voltage.

The present invention has been developed based on the discovery that a drop in breakdown voltage is caused by voids present in the silicon that has been epitaxially grown but nonuniformly in the narrow trench.

In the first aspect of the present invention, a transistor comprises: a drain layer of a first conductivity type; a body layer of a second conductivity type, the body layer being disposed in contact with the drain layer; a narrow trench formed across the body layer and the drain layer and having a bottom, the bottom being located in the drain layer; a source region located at an opening of the narrow trench in the body layer and spaced apart from the drain layer; a filling material formed of an epitaxially grown semiconductor in the narrow trench, having a lower end in contact with the bottom of the narrow trench and an upper end located below an interface between the body layer and the drain layer, and doped with a dopant of the second conductivity type; a gate insulating film formed at least on a portion, at which the body layer is exposed, of inner sidewalls of the narrow trench; and a gate electrode plug, disposed in contact with the gate insulating film in the narrow trench and electrically insulated from the filling material, wherein the narrow trench is formed in a rectangular parallelepiped shape, and a {1 0 0} plane is exposed at one of the inner sidewalls of the narrow trench.

In the second aspect of the present invention transistor according to the first aspect, the transistor is characterized in that the filling material is maintained at a floating potential.

In the third aspect of the present invention according to the first aspect, the transistor is characterized in that the filling material is electrically connected to the source region.

In the fourth aspect of the present invention according to the first aspect, the transistor is characterized by further including: a semiconductor substrate of the first conductivity type on a surface of the drain layer, the surface being opposite to a surface having the body layer located therein; and a drain electrode formed on a surface of the semiconductor substrate, the drain electrode providing an ohmic contact to the semiconductor substrate.

In the fifth aspect of the present invention according to the first aspect, the transistor is characterized by further including: a collector layer of the second conductivity type on a surface of the drain layer, the surface being opposite to a surface having the body layer located therein; and a collector electrode formed on a surface of the collector layer, the collector electrode providing an ohmic contact to the collector layer.

In the sixth aspect of the present invention according to the first aspect, the transistor is characterized in that a Schottky electrode forming a Schottky junction with the drain layer is provided on a surface of the drain layer, the surface being opposite to a surface having the body layer located therein.

In the seventh aspect of the present invention, a diode comprises: a principal semiconductor layer of a first conductivity type; a narrow trench formed in the principal semiconductor layer and having a bottom, the bottom being located in the principal semiconductor layer; a filling material formed of an epitaxially grown semiconductor in the narrow trench and doped with a dopant of a second conductivity type; and a Schottky electrode in contact with surfaces of the principal semiconductor layer and the filling material, the Schottky electrode forming a Schottky junction with the principal semiconductor layer.

In the eighth aspect of the present invention according to the seventh aspect, the diode is characterized in that the Schottky electrode provides an ohmic contact to the filling material.

DETAILED DESCRIPTION OF THE PREFERRED EMBODIMENTS

The present invention will be explained below in more detail with reference to the accompanying drawings in accordance with the embodiments.

Figure 1A:
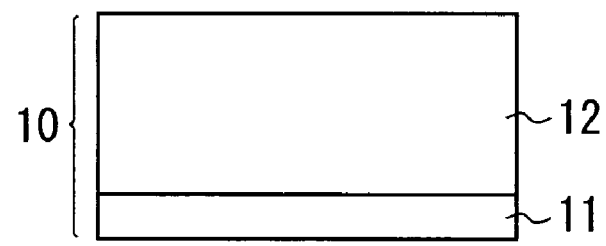
FIGS. 1a to 1c are explanatory views (1) illustrating the process of fabricating a transistor according to an embodiment of the present invention.

Referring now to FIG. 1(a), a processing substrate designated by reference numeral 10, to which the following fabrication process is applied, includes a semiconductor substrate 11 made of single crystal silicon and a drain layer 12 which is made of silicon epitaxially grown on the surface of the semiconductor substrate 11. In this embodiment, explanations, in which a first conductivity type is of N-type and a second conductivity type is of P-type, will be provided.

The semiconductor substrate 11 is of $N^+$-type, having a resistivity of about 0.003 Ω·cm. The drain layer 12 is of $N^-$-type, having a high resistivity. The drain layer 12 is about 18.2 μm in thickness.

Figure 1B:
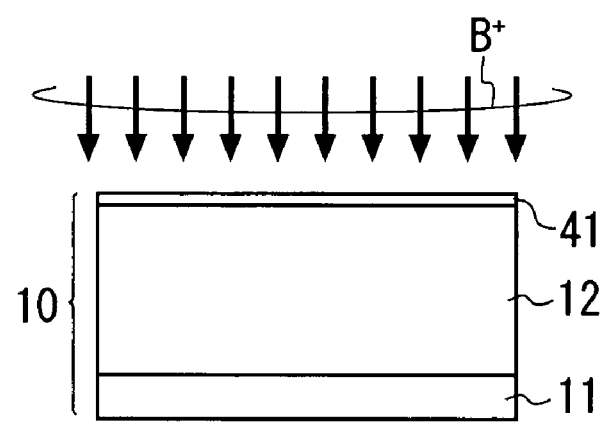

As shown in FIG. 1(b), the surface of the drain layer 12 is exposed to a boron ion ($B^+$) implant, so that boron ions are implanted into the drain layer 12 to form a P-type implanted layer 41 in the surface of the drain layer 12. At this stage, the drain layer 12 is sandwiched between the P-type implanted layer 41 and the semiconductor substrate 11.

Figure 1C:
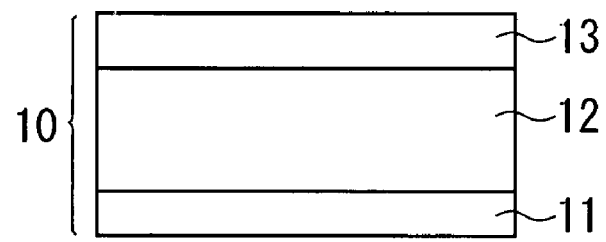

Then, heat treatment is performed to diffuse the boron in the P-type implanted layer 41 into the drain layer 12; thereby, forming a P-type body layer 13 on an inner surface side of the drain layer 12 as shown in FIG. 1(c). The body layer 13 is designed such that its bottom portion is eventually located 1.2 μm deep from the surface of the drain layer 12. At this stage, the depth of the diffusion is less than 1.2 μm to accommodate further diffusion caused by heat treatment to be described later.

At this stage, the drain layer 12 is buried in the processing substrate 10 with no part of the drain layer 12 being exposed at the surface of the processing substrate 10.

Figure 2A:
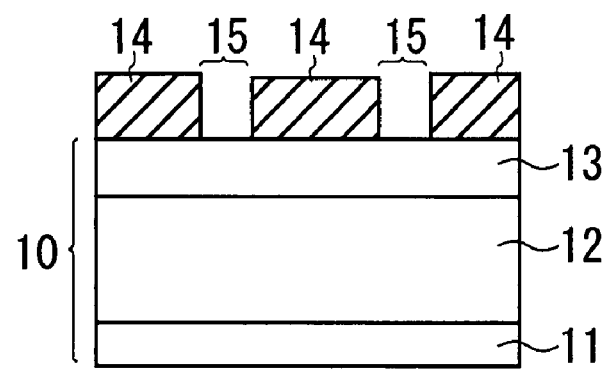
FIGS. 2a to 2c are explanatory views (2) illustrating the process of fabricating the transistor according to the embodiment of the invention.

Then, as shown in FIG. 2a, formed on the surface of the drain layer 12 is a resist film 14, in which a plurality of elongated openings 15 are formed in parallel to each other at predetermined intervals.

Figure 2B:
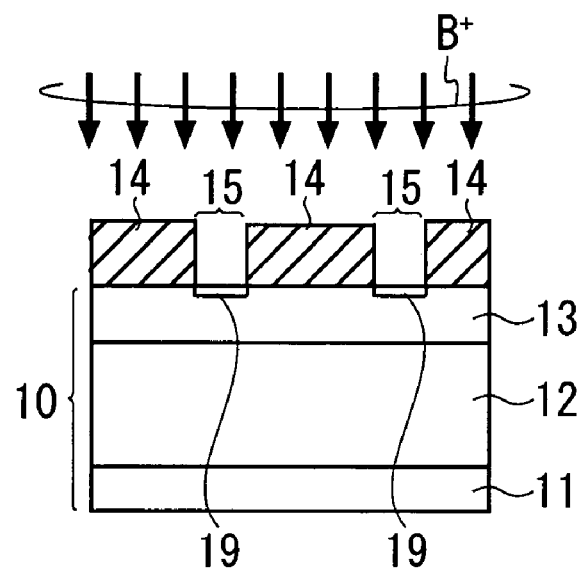

Then, a P-type dopant (boron ions, i.e., $B^+$) implant is performed on the surface having the resist film 14 formed thereon. In this case, the P-type dopant is implanted into the surface of the body layer 13 exposed at the bottom surface of the opening 15 with the resist film 14 being employed as a mask. Thus, as shown in FIG. 2b, a $P^+$ implanted layer 19 is formed on an inner peripheral surface of the body layer 13 in the shape of the pattern which defines the opening 15.

Figure 2C:
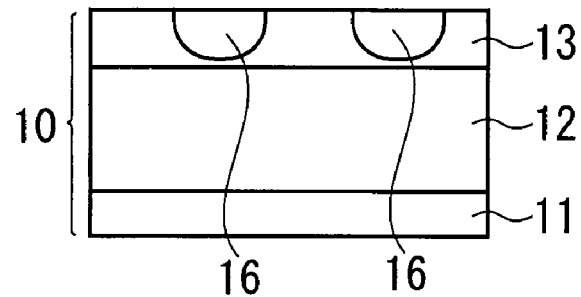

After the resist film 14 has been removed, heat treatment is performed to allow the boron dopant in the $P^+$ implanted layer 19 to diffuse. As shown in FIG. 2c, this causes a plurality of $P^+$ type ohmic regions 16 to be formed in parallel to each other on the inner peripheral surface of the body layer 13. The ohmic region 16 has a diffusion depth of about 1.0 μm.

Figure 3A:
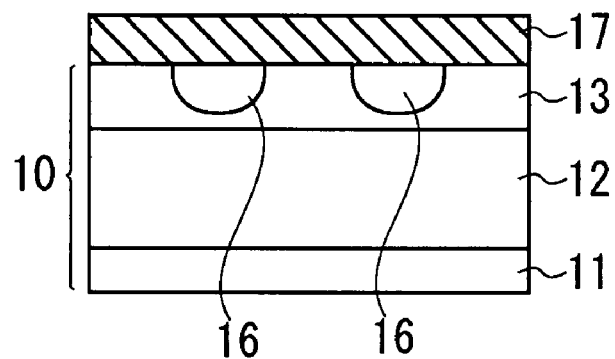
FIGS. 3a to 3c are explanatory views (3) illustrating the process of fabricating the transistor according to the embodiment of the invention.
Figure 3B:
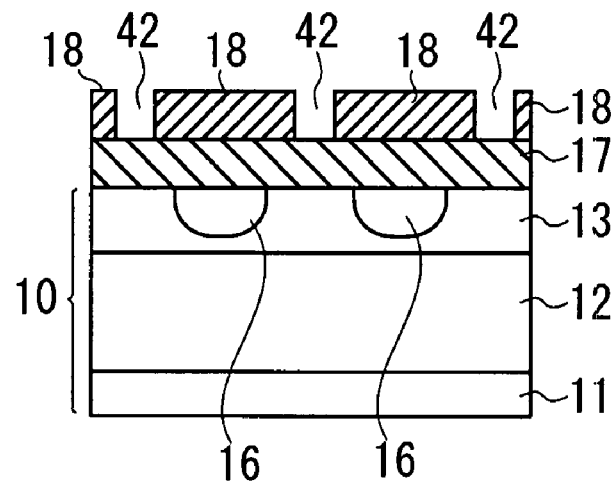

Then, as shown in FIG. 3a, with both the body layer 13 and the ohmic region 16 being exposed, a silicon oxide film 17 is formed by CVD on the surface thereof. Thereafter, as shown in FIG. 3b, a patterned resist film 18 is formed on the surface of the silicon oxide film 17.

The resist film 18 has elongated openings 42, each opening being located between the adjacent ohmic regions 16 in the longitudinal direction of the ohmic region 16.

Figure 3C:
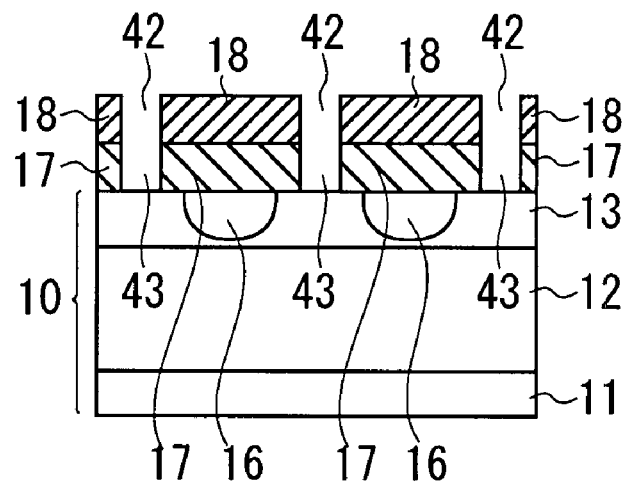

With this structural arrangement, etching is performed to remove the silicon oxide film 17 that is present at the bottom of the opening 42, such that the silicon oxide film 17 is patterned in the same shape as the resist film 18. This patterning provides the silicon oxide film 17 with openings 43 that are the same in shape as the opening 42 in the resist film 18, as shown in FIG. 3c.

Figure 4A:
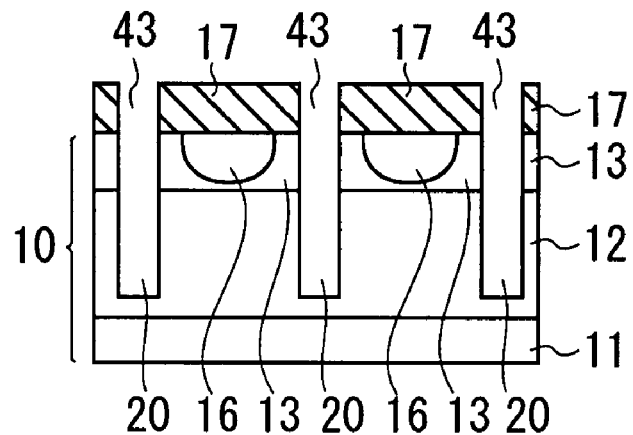
FIGS. 4a to 4c are explanatory views (4) illustrating the process of fabricating the transistor according to the embodiment of the invention.

With this structural arrangement, a portion of the body layer 13 of the processing substrate 10 is exposed at the bottom of the opening 43 in the silicon oxide film 17. The resist film 18 is then removed and the portion of the processing substrate 10, present at the bottom of the opening 43, is etched with the patterned silicon oxide film 17 being employed as a mask. As shown in FIG. 4a, this allows for forming a narrow trench 20 in the same pattern as that of the opening 43 in the silicon oxide film 17.

The narrow trench 20 penetrates the body layer 13, with the bottom of the narrow trench 20 sitting in an underlying layer, that is the drain layer 12 beneath the body layer 13. At this stage, the narrow trench 20 has a depth of 12 μm from the surface of the processing substrate 10.

At the sidewalls of the opening of the narrow trench 20, the silicon oxide film 17 is exposed; and the silicon forming the processing substrate 10 is exposed at the portion below the silicon oxide film 17.

The opening 42 in the resist film 18 has a width less than the interval of the ohmic regions 16, and is located generally at the center between adjacent ohmic regions 16. Thus, the narrow trench 20 is located between the ohmic regions 16 and spaced apart from the edge portion of the ohmic region 16. This prevents the ohmic region 16 in the processing substrate 10 from being exposed at the sidewall of the narrow trench 20, but allows the body layer 13 and its underlying layer (i.e., the drain layer 12 to be exposed). The drain layer 12 is exposed at the bottom of the narrow trench 20.

The narrow trench 20 is formed as described above, where the processing substrate 10 is exposed only at the bottom and inner surface of the narrow trench 20 on the surface side of the processing substrate 10.

With this structural arrangement, the processing substrate 10 is loaded into a CVD reactor, into which a raw material gas containing silicon and a dopant gas containing a P-type dopant are introduced at a high temperature. This causes the silicon and the P-type dopant to start precipitating out of the gases to deposit on the bottom and sidewalls of the narrow trench 20; thereby, initiating the epitaxial growth of P-type single crystal silicon.

The processing substrate 10 used in this embodiment has a {1 0 0} oriented surface. The opening 42 in the resist film 18 is rectangular in planar shape. Upon forming the opening 42, the processing substrate 10 and the mask for patterning the resist film 18 are aligned with each other in a manner such that a longer or shorter side of the opening 42 is disposed along the x-axis or y-axis, respectively, which defines the {1 0 0} plane of the processing substrate 10.

Since the opening of the narrow trench 20 is the same in planar shape and located at the same position as the opening 42, a longer or shorter side of the narrow trench 20 is aligned with the x-axis or y-axis.

Figure 11:
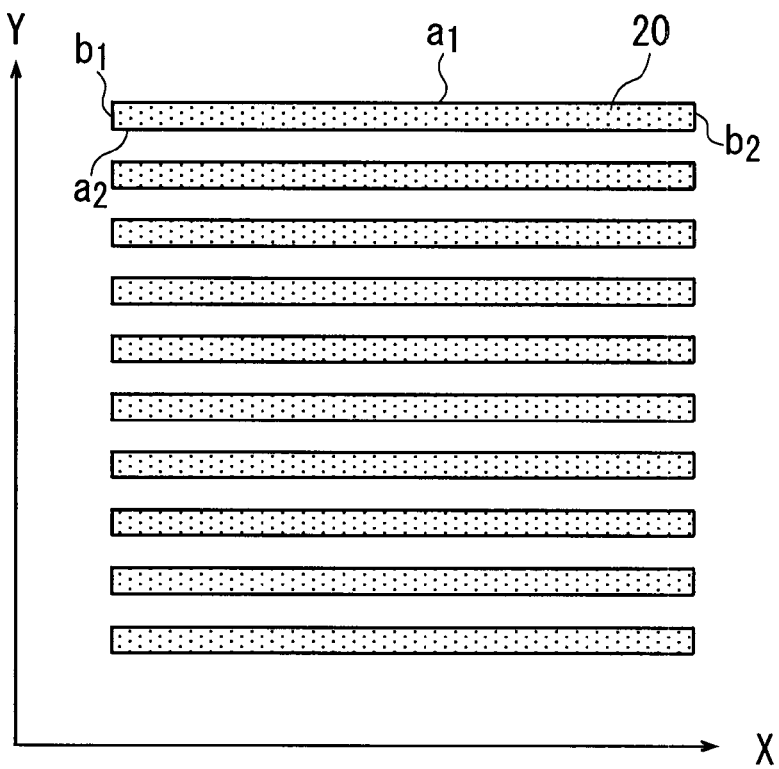
FIG. 11 is an explanatory plan view illustrating the arrangement of narrow trenches in a transistor and a diode according to the present invention.

FIG. 11 is a plan view illustrating a plurality of narrow trenches 20 having the same shape and disposed at equal intervals in parallel to each other. In FIG. 11, the longer sides $a_1$, $a_2$ of the narrow trench 20 are disposed along the x-axis and thus parallel to the x-axis. Accordingly, the shorter sides $b_1$, $b_2$ of the narrow trench 20 are parallel to the y-axis.

Figure 12:
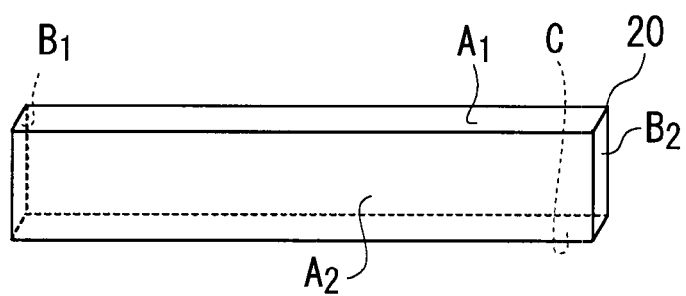
FIG. 12 is an explanatory perspective view illustrating the three-dimensional shape of a narrow trench in a transistor and a diode according to the present invention.

FIG. 12 is a perspective view illustrating the interior of the narrow trench 20. As shown in FIG. 12, the inner space of the narrow trench 20 (i.e., the region that forms the inner volume of the narrow trench 20) is made up of a rectangular parallelepiped. That is, the four sidewalls $A_1$, $A_2$, $B_1$, $B_2$ of the narrow trench 20 are a plane perpendicular to the surface of the processing substrate 10; thus allowing, any adjacent sidewalls to be orthogonal to each other. In addition, the bottom C of the narrow trench 20 is parallel to the surface of the processing substrate 10; thus, being perpendicular to the four sidewalls $A_1$, $A_2$, $B_1$, $B_2$.

Therefore, portions of the four sidewalls $A_1$, $A_2$, $B_1$, $B_2$ and the bottom C of the narrow trench 20, at which the narrow trench 20 is exposed, are a {1 0 0} oriented plane of a single crystal silicon.

The {1 0 0} represents all the following orientations:
(1 0 0), (0 1 0), (0 0 1), ($\overline{1}$ 0 0), (0 $\overline{1}$ 0), (0 0 $\overline{1}$), Accordingly, when the processing substrate 10 has a (1 0 0) oriented surface and a (0 1 0) plane is exposed at the two longitudinal sidewalls $A_1$, $A_2$ of the narrow trench 20, a (0 0 1) plane or a (0 0 $\overline{1}$) plane is exposed at the shorter sidewalls $B_1$, $B_2$ (the bottom C has the same orientation as that of the surface of the processing substrate 10).

Figure 4B:
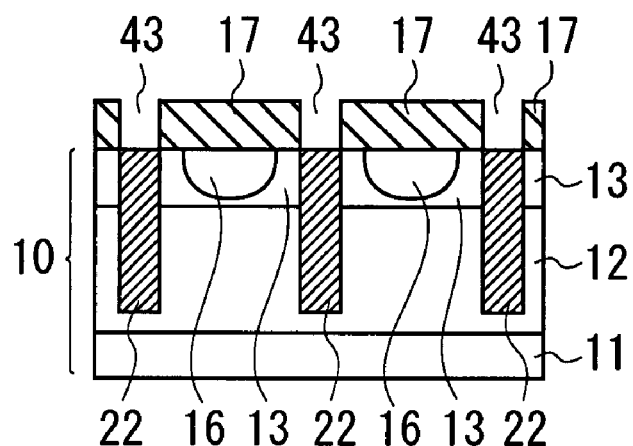

Thus, all the planes of the processing substrate 10 exposed at the four sidewalls $A_1$, $A_2$, $B_1$, $B_2$ and the bottom C have the same orientation of {1 0 0}. This allows for uniform epitaxial growth of silicon on any plane of the processing substrate 10. As shown in FIG. 4b, the portion of the narrow trench 20 below the silicon oxide film 17 is filled with a filling material 22 made up of an epitaxially grown silicon layer. Since no silicon is epitaxially grown on the portion at which the silicon oxide film 17 is exposed, the opening 43 in the silicon oxide film 17 remains.

On the other hand, suppose that a {110} or {111} plane is exposed at the narrow trench 20. In this case, all the surfaces of the processing substrate 10 exposed at the four sidewalls $A_1$, $A_2$, $B_1$, $B_2$ and the bottom C could not have the same orientation. This would cause the epitaxial growth rate of silicon to vary at different portions on the surfaces of the processing substrate 10 exposed at the narrow trench 20, such that nonuniform silicon is epitaxially grown; thereby, resulting in voids formed in the narrow trench 20.

Figure 13:
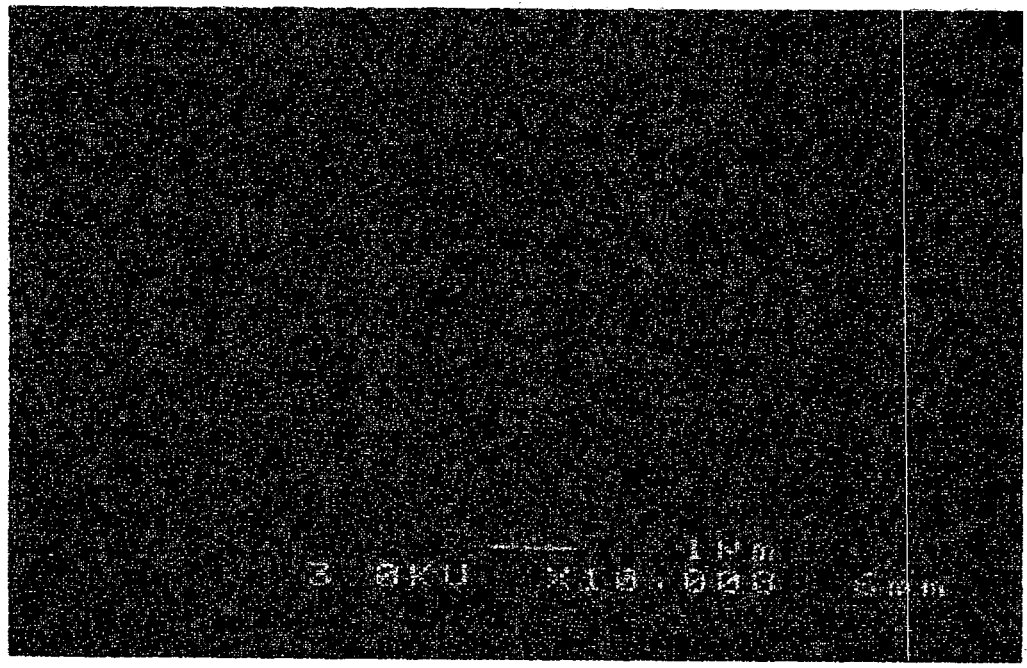
FIG. 13 is a view illustrating a cross-sectional microscopic picture of a filling material having a {1 0 0} plane exposed at the sidewalls of a narrow trench in a transistor according to the present invention.

FIG. 13 is an electron microscopic picture of the narrow trench 20 in cross section when filled with an epitaxially grown layer of silicon according to the method of the invention. As can be seen from FIG. 13, no voids are created.

Figure 14:
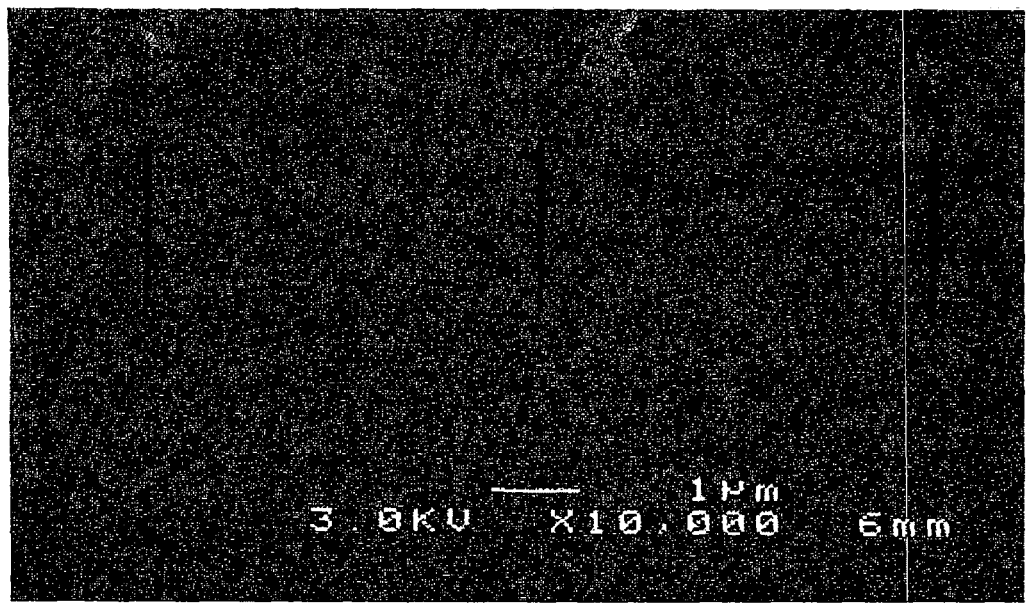
FIG. 14 is a view illustrating a cross-sectional microscopic picture of a filling material having a <110> plane exposed at the sidewalls of a narrow trench in a transistor according to the present invention.

FIG. 14 is an electron microscopic picture of the narrow trench in cross section when filled with an epitaxially grown layer of silicon with a (110) plane being exposed at the sidewall $A_1$ of the narrow trench. In FIG. 14, long voids can be seen in the picture in the vertical direction.

Figure 4C:
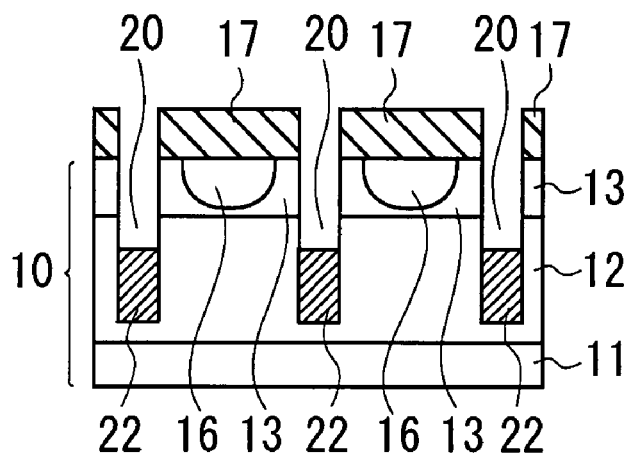

Subsequently, with the silicon oxide film 17 being employed as a mask, the upper portion of the filling material 22 is etched to expose the body layer 13 from its upper to lower end and the drain layer 12 from its upper end to a predetermined depth at the narrow trench 20, as shown in FIG. 4c. With this structural arrangement, the surface of the filling material 22 is located below the P-N junction formed by the body layer 13 and the drain layer 12. At this stage, the surface of the filling material 22 is located at a depth of 1.6 μm from the surface of the processing substrate 10.

Figure 5A:
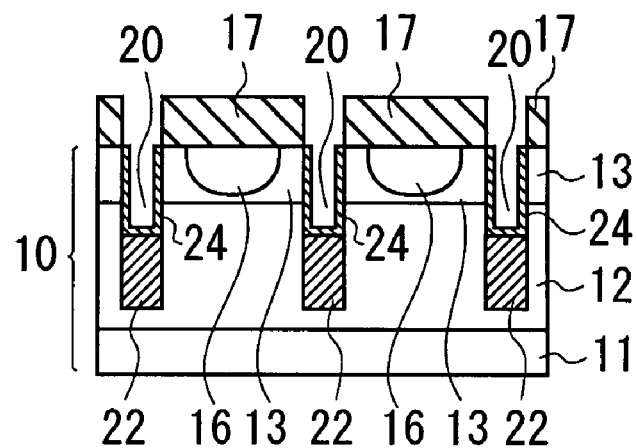
FIGS. 5a to 5c are explanatory views (5) illustrating the process of fabricating the transistor according to the embodiment of the invention.

With this structural arrangement, the processing substrate 10 is then thermally oxidized, such that a gate insulating film 24 comprising a silicon oxide thin film is formed on the surface of the processing substrate 10 exposed at the narrow trench 20, as shown in FIG. 5a.

At this stage, the bottom C of the narrow trench 20 is provided with the gate insulating film 24, while the four sidewalls $A_1$, $A_2$, $B_1$, $B_2$ are provided with the silicon oxide film 17 and the gate insulating film 24.

Figure 5B:
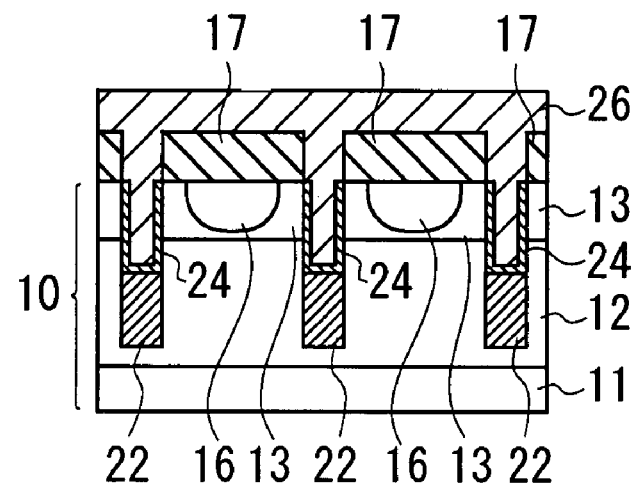

Then, polysilicon is deposited on a surface of the processing substrate 10, with the surface having the opening of the narrow trench 20 located thereon, in order to form a polysilicon thin film 26 as shown in FIG. 5b; thereby, causing the narrow trench 20 to be filled with the polysilicon thin film 26.

Figure 5C:
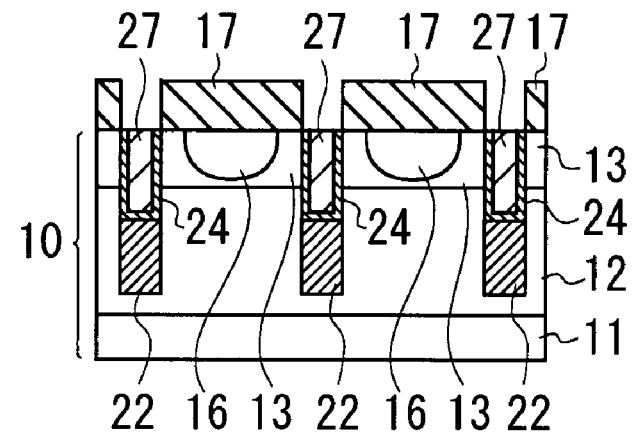

With this structural arrangement, the polysilicon thin film 26 has been formed not only in the narrow trench 20 but also on the surface of the silicon oxide film 17. The polysilicon thin film 26 is then etched a predetermined amount in this arrangement to remove the polysilicon thin film 26 deposited on the silicon oxide film 17 and the polysilicon thin film 26 deposited in the upper end portion of the narrow trench 20. This causes the polysilicon thin film 26 in each narrow trench 20 to be separated from another. Thus, as shown in FIG. 5c, each narrow trench 20 is filled with a gate electrode plug made of the remaining portion of the polysilicon thin film 26. The gate electrode plug 27 is surrounded by the gate insulating film 24 in the narrow trench 20 so that the gate electrode plug 27 does not contact with the body layer 13 forming the semiconductor substrate 10, the drain layer 12 and the filling material 22.

Figure 6A:
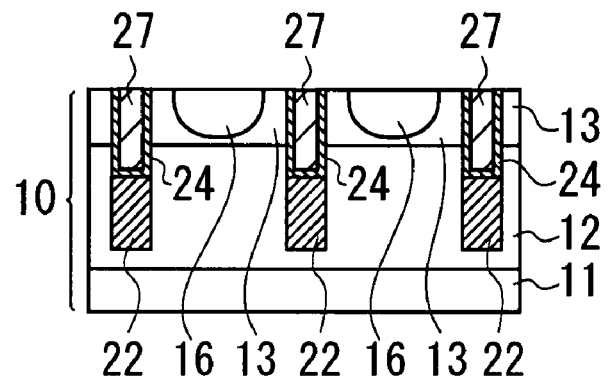
FIGS. 6a to 6c are explanatory views (6) illustrating the process of fabricating the transistor according to the embodiment of the invention.

Then, as shown in FIG. 6a, the silicon oxide film 17 is removed in order to expose the body layer 13 and the ohmic region 16 of the processing substrate 10. At this stage, the surface of the gate electrode plug 27 in the narrow trench 20 and the upper end of the gate insulating film 24 are also exposed. The surface of the processing substrate 10 is flat, which includes the surface of the body layer 13, the surface of the ohmic region 16, the upper end of the gate electrode plug 27, and the upper end of the gate insulating film 24.

The ohmic region 16 and the opening of the narrow trench 20 or the gate electrode plug 27 have the planar shape of an elongated rectangle and are arranged alternately in parallel to each other.

Figure 6B:
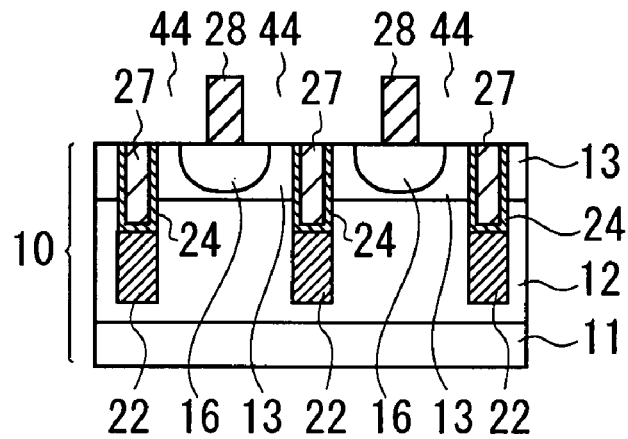

Then, as shown in FIG. 6b, a resist is patterned to form an elongated resist film 28, which is less in width than the ohmic region 16 and which is located at the center in width of the ohmic region 16. At both sides of the resist film 28, exposed are the ohmic regions 16.

Figure 6C:
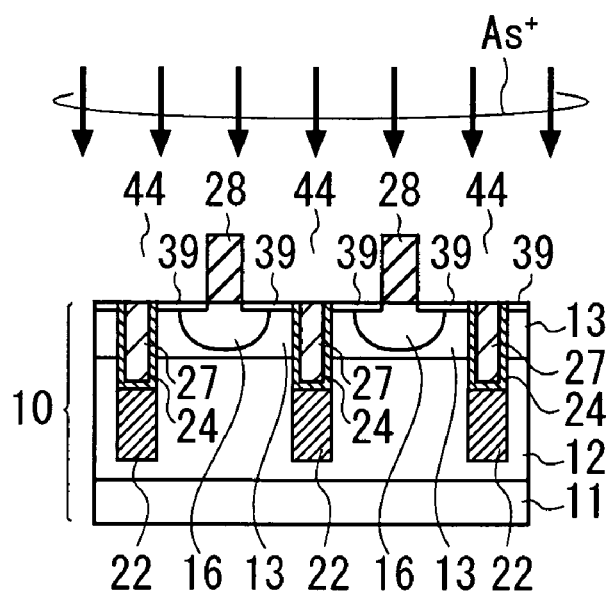

Reference numeral 44 indicates the exposed surface of the resist film 28, on which no resist film 28 is formed. With this structural arrangement, as shown in FIG. 6c, an N-type dopant (arsenide ions, $As^+$, in this embodiment) implant is performed on the surface having the resist film 28 formed thereon. This causes the N-type dopant to be implanted into the exposed surface 44; thereby, forming an $N^+$-type implanted layer 39 on the inner peripheral surface of the ohmic region 16 and the body layer 13. The $N^+$-type implanted layer 39 is formed over a region between the resist film 28 and the narrow trench 20, such that the $N^+$-type implanted layer 39 is formed in a surface of the ohmic region 16, the surface being not covered with the resist film 28, and in the surface of the body layer 13.

Figure 7A:
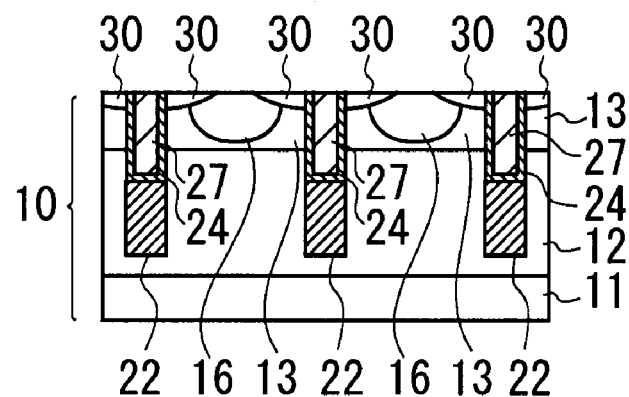
FIGS. 7a to 7c are explanatory views (7) illustrating the process of fabricating the transistor according to the embodiment of the invention.

Heat treatment is performed after the resist film 28 has been removed. This causes the dopant in the $N^+$-type implanted layer 39 to diffuse; thereby, forming an N-type source region 30 on the inner peripheral surface of the body layer 13 and the ohmic region 16, as shown in FIG. 7a.

The source region 30 extends at least along the longitudinal direction of the narrow trench 20. Accordingly, the surface of the source region 30 is exposed at least at both the longitudinal sides of the narrow trench 20.

The dopant in the $N^+$-type implanted layer 39 diffuses laterally onto the surface of the ohmic region 16. However, due to a small amount of lateral diffusion, a remaining surface of the ohmic region 16 is exposed at the center portion at a width thereof where the resist film 28 was present before having been removed.

In addition, the $N^+$-type implanted layer 39 is in contact with the gate insulating film 24 that is formed on the sidewalls of the narrow trench 20; thereby, preventing the N-type dopant from diffusing into the gate insulating film 24. For this reason, the source region 30 is in contact with the gate insulating film 24 over the depth of diffusion of the source region 30 from the upper end of the gate insulating film 24. Accordingly, with this structural arrangement, the gate insulating film 24 between the bottom of the source region 30 and the upper end of the drain layer 12 is in contact with the body layer 13 to form an interface (i.e., a so-called channel region between the gate insulating film 24 and the body layer 13).

Figure 7B:
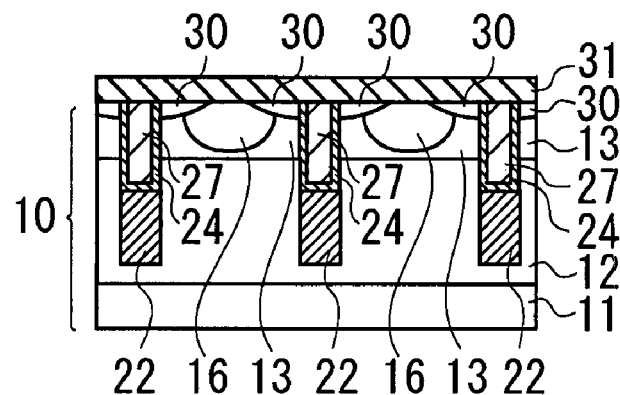
Figure 7C:
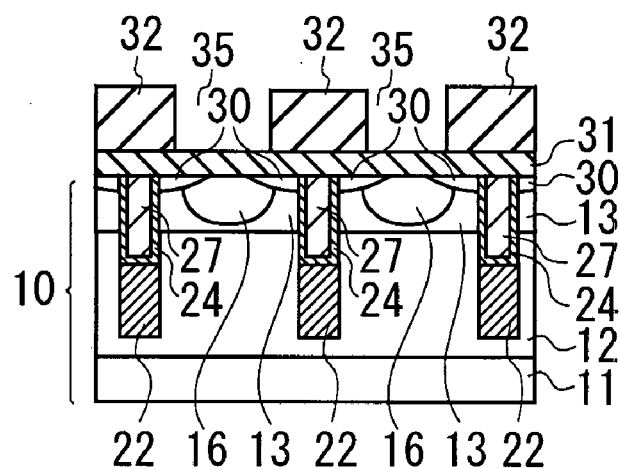

Then, as shown in FIG. 7b, an interlayer insulation film 31 of silicon dioxide is deposited by CVD on the entire surface of the semiconductor substrate; thereby, forming a patterned resist film 32 on the surface of the interlayer insulation film 31 as shown in FIG. 7c.

The resist film 32 has patterned elongated openings 35 each located between adjacent narrow trenches 20, and is formed at least on top portion of the narrow trench 20.

Figure 8A:
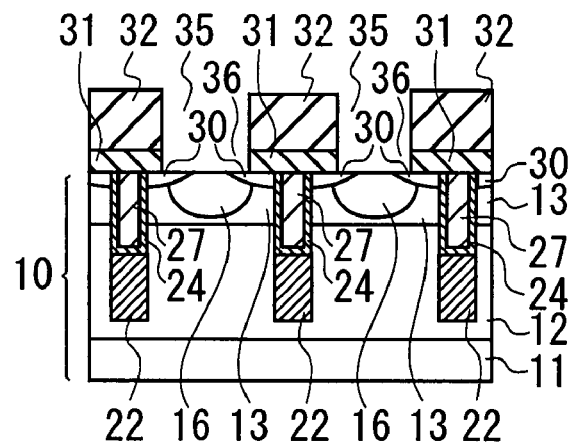
FIGS. 8a to 8c are explanatory views (8) illustrating the process of fabricating the transistor according to the embodiment of the invention.

The interlayer insulation film 31 is exposed at the bottom of the opening 35. When a portion of the interlayer insulation film 31 at the bottom of the opening 35 is etched and thereby removed, an opening 36 is formed in the interlayer insulation film 31, the opening 36 having the same planar pattern as that of the opening 35 in the resist film 32 as shown in FIG. 8a. The opening 36 has a long and narrow shape.

At the bottom of the opening 36 in the interlayer insulation film 31, the ohmic region 16 is exposed in a long and narrow shape at the center portion along the width of the long and narrow shaped opening 36, and the source regions 30 are exposed at both the sides thereof. The upper end of the gate electrode plug 27 is not exposed at the bottom of the opening 36.

Figure 8B:
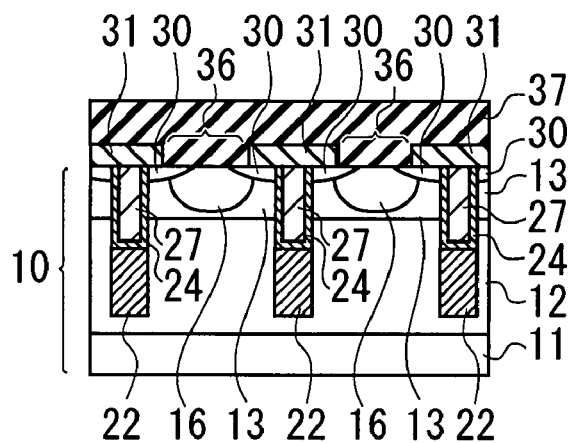

Then, after the resist film 32 is removed, an aluminum thin film is formed by evaporation or sputtering on the surface of the processing substrate 10 having the opening 36 thereon and then patterned to form a source electrode film and a gate electrode film. The source and gate electrode films are separated from each other in order to allow different voltages to be applied thereto. Reference numeral 37 in FIG. 8b indicates the source electrode film.

The source electrode film 37 is connected to the source region 30 and the ohmic region 16 on the bottom of the opening 36. The source electrode film 37 is electrically insulated from the gate electrode plug 27 by the interlayer insulation film 31.

On the other hand, the gate electrode film is connected to the gate electrode plug 27 in each narrow trench 20. A voltage to be applied to the gate electrode film is also applied to the gate electrode plug 27 in each narrow trench 20.

Figure 8C:
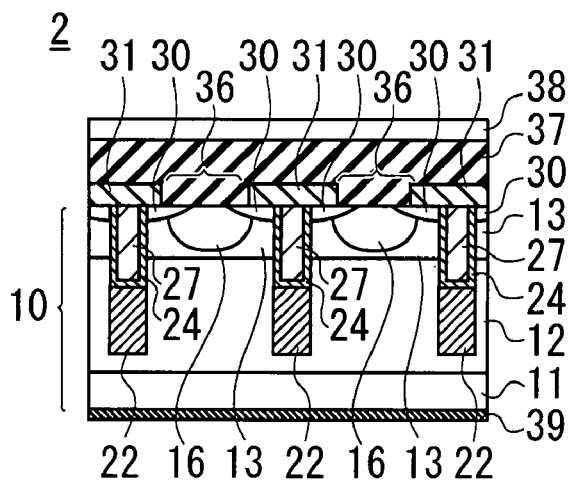

Then, as shown in FIG. 8c, an insulative protection film 38, which is made up of silicon dioxide thin film or the like, is formed on the surfaces of the source electrode film 37 and the gate electrode film and then patterned to expose a part of the source electrode film 37 and the gate electrode film. Thereafter, formed on the backside of the processing substrate 10 is a thin metal film, which constitutes a drain electrode film 39; thereby, providing a power MOSFET transistor 2. The drain electrode film 39 provides an ohmic contact to the semiconductor substrate 11.

A plurality of patterns to provide the transistor 2 described above are formed in one processing substrate 10 and the processing substrate 10 is diced into the individual patterns. Thereafter, the gate electrode film, the source electrode film 37, and the drain electrode film 39 are connected to metal terminals, respectively; and then, the transistor 2 is encapsulated in resin; thereby, providing a packaged transistor 2.

Suppose that, with the metal terminals being connected to a power supply or an electric circuit, the source electrode film 37 is connected to a ground potential and a positive voltage is applied to the drain electrode film 39, while a voltage is applied to the gate electrode film and a positive voltage equal to or greater than the threshold voltage is applied to the gate electrode plug 27 in each narrow trench 20. In this case, an N-type inverted layer is formed in the channel region (at the interface between the body layer 13 and the gate insulating film 24) to connect between the source region 30 and the drain layer 12; thereby, allowing current to flow from the drain layer 12 toward the source region 30. At this stage, the transistor 2 is in a conduction state.

From this state, making the potential of each gate electrode plug 27 equal to the source potential causes the inverted layer to disappear and no more current to flow. At this stage, the transistor 2 is in the off state.

With the transistor 2 being in the off state and a high voltage being applied between the drain electrode film 39 and the source electrode film 37, the P-N junction formed by the body layer 13 and the drain layer 12 is reverse biased; thereby, causing a depletion layer to extend into the body layer 13 and the drain layer 12.

The filling material 22 comprising a semiconductor grown by epitaxial method, present in the bottom portion of the narrow trench 20, is opposite in conduction type to the drain layer 12. Since the filling material 22 is not electrically connected to the drain layer 12, a depletion layer extends into the filling material 22 when the depletion layer extends into the drain layer 12.

Figure 9:
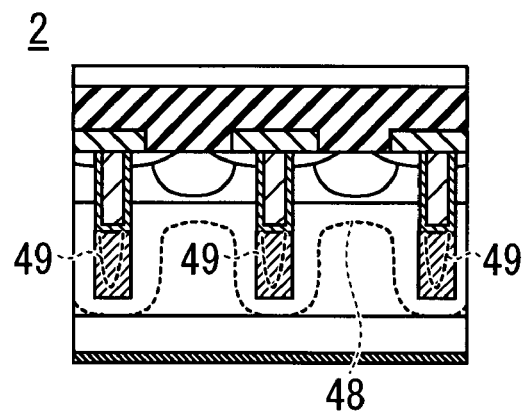
FIG. 9 is an explanatory view illustrating the state of a depletion layer in a transistor according to the present invention.

Reference numeral 48 in FIG. 9 indicates the edge of a depletion layer that extends into the drain layer 12 from the P-N junction formed between the P-type body layer 13, the filling material 22, and the N-type drain layer 12. On the other hand, reference numeral 49 indicates the edge of a depletion layer that extends into the filling material 22 from the P-N junction formed between the filling material 22 and the drain layer 12.

In the state shown in FIG. 9, a further increase in voltage between the drain electrode film 39 and the source electrode film 37 would cause the filling material 22 to be completely depleted.

In the transistor 2 according to the present invention, the distance between the filling materials 22, the width of the filling material 22, and the concentration of the filling material 22 and the drain layer 12 are optimized. This allows a portion of the drain layer 12 located between the narrow trenches 20 and between the filling materials 22 to be completely depleted when a voltage enough to completely deplete the filling material 22 is applied between the drain electrode film 39 and the source electrode film 37.

With the portion of the drain layer 12 located between the filling materials 22 being completely depleted, the electric field established in the depletion layer has a constant strength in the direction of depth of the drain layer 12.

Figure 10:
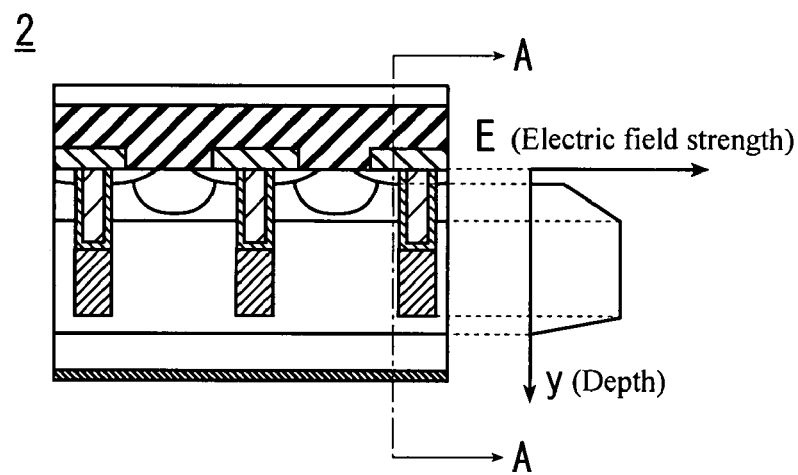
FIG. 10 is an explanatory view illustrating the strength distribution of an electric field in a transistor according to the present invention.

FIG. 10 is a graph showing the depth—electric field strength relationship within the transistor 2 under the aforementioned condition. The graph in FIG. 10 shows the strength of an electric field between the narrow trenches 20 along line A-A that passes through the source region 30, the body layer 13, and the drain layer 12.

In this case, the presence of a void in the filling material 22 would cause a drop in breakdown voltage therein. However, in the transistor 2 according to the present invention, the filling material 22 is made up of a {1 0 0} oriented crystal semiconductor that is epitaxially grown at a constant rate; thereby, creating no voids therein and thus causing no reduction in breakdown voltage.

The embodiment of a MOS field effect transistor has been described above; however, the present invention is not limited thereto.

Figure 15:
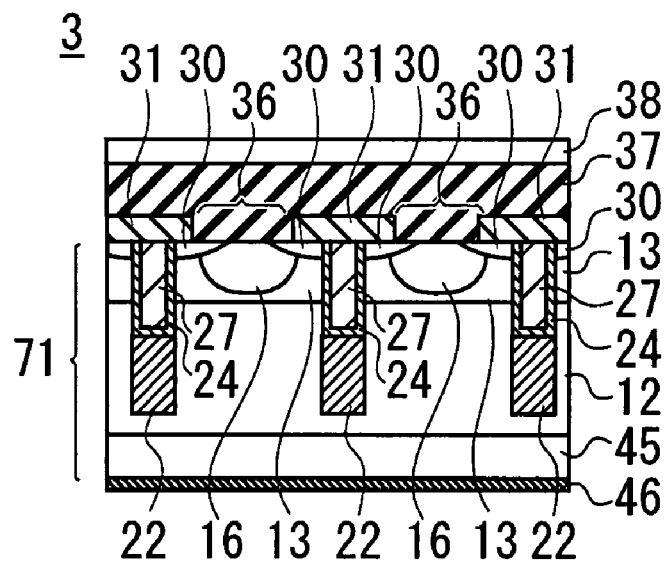
FIG. 15 is a view illustrating a P-N junction IGBT or an exemplary transistor according to the present invention.

Reference numeral 3 in FIG. 15 indicates a P-N junction IGBT according to another embodiment of the invention. In FIG. 15, like reference numerals designate like components as for the transistor 2 shown in FIG. 8c. The sidewalls and bottom of the narrow trench 20 in the transistor 3 (and a transistor 4 in FIG. 16, described later) have an orientation of {1 0 0}, and the filling material 22 that fills in the narrow trench 20 is a {1 0 0} oriented single crystal semiconductor that has been epitaxially grown. The transistor 3 has a planar pattern as shown in FIG. 11, in which a plurality of narrow trenches 20 are disposed in parallel to each other and the inner volume of each narrow trench 20 is defined by a rectangular parallelepiped as shown in FIG. 12.

The transistor 3 of FIG. 15 is different from the transistor 2 of FIG. 8c in the following point. The processing substrate 10 of the transistor 2 in FIG. 8c has the drain layer 12 of N-type (a first conductivity type) formed by being epitaxially grown on the semiconductor substrate 11 of an N-type single crystal semiconductor. On the other hand, a processing substrate 71 of an N-type (a first conductivity type) in FIG. 15 has the N-type drain layer 12 formed by being epitaxially grown on a P-type semiconductor substrate 45.

Reference numeral 46 in FIG. 15 indicates a collector electrode made up of a thin metal film that is formed on the surface of the P-type semiconductor substrate 45. The collector electrode 46 provides an ohmic contact to the P-type semiconductor substrate 45.

In the transistor 3 described above, minority carriers are injected from the semiconductor substrate 45 into the drain layer 12; thereby, causing the conductivity of the drain layer 12 to be modulated. This results in a lower resistance of the drain layer 12 in conduction state in comparison with the MOSFET transistor 2.

Figure 16:
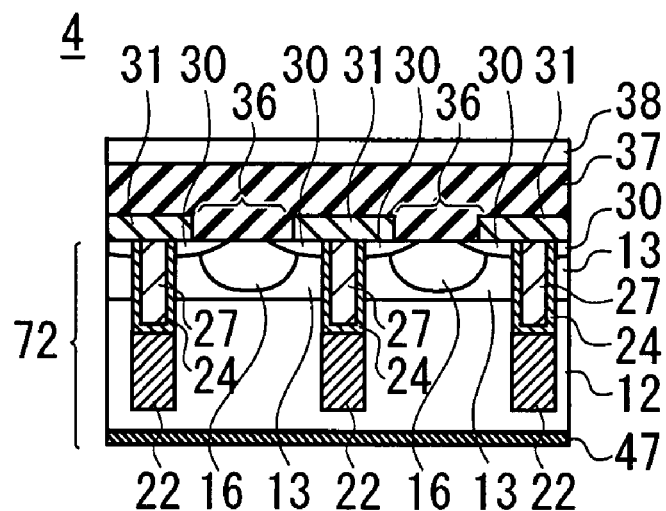
FIG. 16 is a view illustrating a Schottky junction IGBT or an exemplary transistor according to the present invention.

Now, the transistor 4 illustrated in FIG. 16 is explained below. The transistor 4 is a Schottky junction IGBT according to an example of the invention. In FIG. 16, like reference numerals designate like components as for the transistor 2 shown in FIG. 8c, like reference numerals shown in FIG. 15.

A processing substrate 72 of the transistor 4 in FIG. 16 includes a Schottky electrode 47 made of thin metal film and formed on the surface of a drain layer 12 of N-type (a first conductivity type) with a high resistivity.

The Schottky electrode 47 forms a Schottky junction with the drain layer 12. Between the Schottky electrode 47 and the drain layer 12, formed is a diode having the Schottky electrode 47 as the anode and the drain layer 12 as the cathode.

In the transistor 4 described above, minority carriers are injected from the Schottky electrode 47 into the drain layer 12, thereby causing the conductivity of the drain layer 12 to be modulated. This results in a lower resistance of the drain layer 12 in conduction state. However, the resistance of the transistor 4 is greater than that of the P-N junction IGBT shown in FIG. 15.

In any of the transistors 2 to 4 described above, the filling material 22 in the narrow trench 20 is not connected to the source electrode 37, the gate electrode plug 27, the drain electrode 39, the collector electrode 46, and the Schottky electrode 47, but maintained at a floating potential. However, the filling material 22 in each narrow trench 20 may be connected to the source electrode 37 such that the same voltage as that of the source region 30 is applied to the filling material 22.

However, the depletion layer expands in a slightly different manner when the filling material 22 is maintained at a floating potential from when the filling material 22 is connected to the source electrode 37.

With the filling material 22 being maintained at a floating potential, a portion of the filling material 22 in contact with the edge of the depletion layer is at the same potential as the drain electrode 39 when the edge of the depletion layer, which extends from the P-N junction at the interface between the body layer 13 and the drain layer 12 into the drain layer 12, has reached the filling material 22.

When the potential difference between the drain electrode 39 and the source electrode 37 becomes larger than that, the depletion layer is created in the filling material 22 as well.

On the other hand, with the filling material 22 being connected to the source electrode 37, the filling material 22 is at the same potential as the source electrode. When a voltage is applied between the drain electrode 39 and the source electrode 37, and the P-N junction between the filling material 22 and the drain layer 12 is reverse biased, the depletion layer is immediately created in the filling material 22.

In any case, when the filling material 22 is completely depleted and a portion of the drain layer 12 located between adjacent filling materials 22 is depleted, the electric field strength E becomes constant, as shown in FIG. 10, in a region from the P-N junction at the interface between the body layer 13 and the drain layer 12 to the bottom of the filling material 22.

This prevents application of an intensively strong electric field as in the prior art. When the same voltage as applied to a transistor having the conventional structure is applied to the transistor according to the present invention, a lower electric field is established in the region from the interface between the body layer 13 and the drain layer 12 to the bottom of the filling material 22 in comparison with the transistor having the conventional structure; thereby, providing a higher breakdown voltage.

The transistors 2 to 4 have been explained above as the embodiments. However, the present invention is not limited to transistors but may be applied to diodes.

Figure 17A:
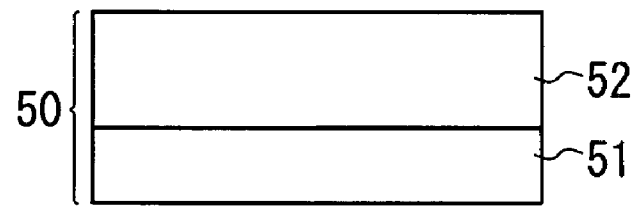
FIGS. 17a to 17c are explanatory views (1) illustrating the process of fabricating a diode according to an embodiment of the invention.
Figure 17B:
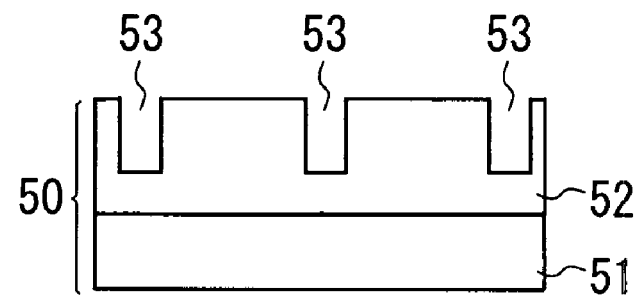
Figure 18A:
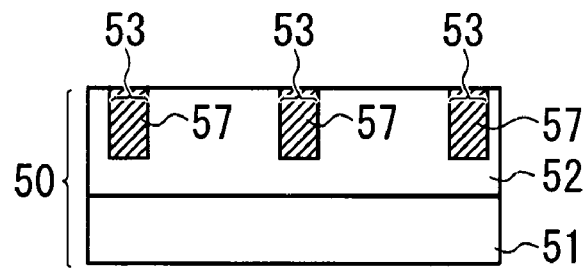
FIGS. 18a to 18c are explanatory views (2) illustrating the process of fabricating the diode according to the embodiment of the invention.
Figure 18B:
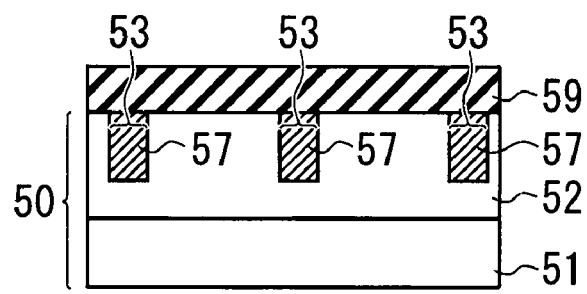
Figure 18C:
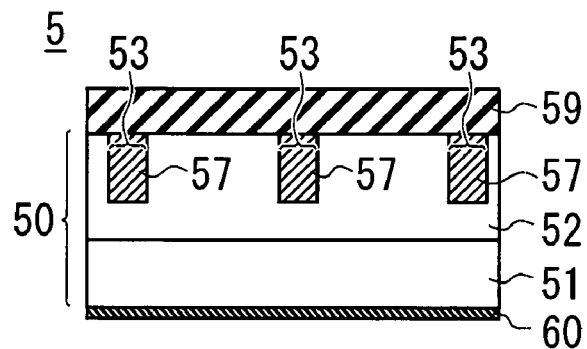

Reference numeral 5 of FIG. 18c indicates a diode according to an example of the present invention. The process of fabricating the diode 5 is explained below. First, as shown in FIG. 17a, a processing substrate 50 is prepared which includes an N$^+$-type semiconductor substrate 51 and an N$^-$-type principal semiconductor layer 52 provided on the semiconductor substrate 51. Then, elongated narrow trenches 53 are formed in the surface of the principal semiconductor layer 52.

Like the narrow trenches 20 shown in FIG. 11, a plurality of narrow trenches 53 are arranged in parallel to each other with the inner volume of each narrow trench 53 being formed by a rectangular parallelepiped as the narrow trench 20 of FIG. 12.

The semiconductor substrate 51 is made of a single crystal semiconductor (such as, silicon) that is highly doped with an N-type dopant. On the other hand, the principal semiconductor layer 52 is made of a single crystal semiconductor that is doped with a small amount of an N-type dopant and epitaxially grown.

The opening of the narrow trench 53 is rectangular in shape with the four sidewalls of the narrow trench 53 being perpendicular to the surface of the principal semiconductor layer 52. In addition, the bottom of the narrow trench 53 is parallel to the surface of the principal semiconductor layer 52.

Figure 17C:
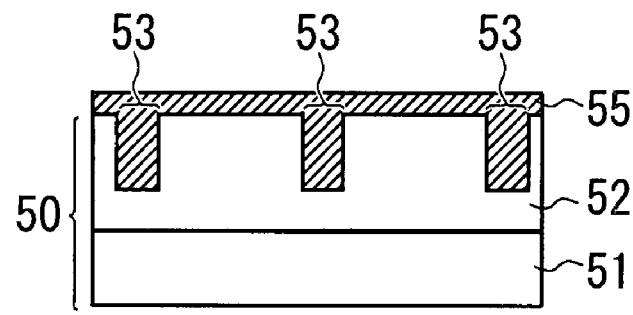

The sidewalls and bottom of the narrow trench 53 have an orientation of {1 0 0}. As shown in FIG. 17c, when silicon is epitaxially grown on the surface of the processing substrate 50 in which the narrow trenches 53 are formed, the narrow trench 53 is filled with a silicon epitaxial layer 55. When epitaxially grown, the epitaxial layer 55 is doped with a P-type dopant to be of P-type.

With this structural arrangement, the silicon epitaxial layer 55 has also been grown on the surface of the principal semiconductor layer 52 that is exposed between the narrow trenches 53. As shown in FIG. 18a, when the silicon epitaxial layer 55 is etched until the surface of the principal semiconductor layer 52 is exposed, a filling material 57 is formed in each of the narrow trenches 53, where the filling material 57 is made up of a remaining portion of the silicon epitaxial layer 55. With the surface of the principal semiconductor layer 52 being exposed, the filling materials 57 in each of the narrow trenches 53 are separated from each other.

Subsequently, a thin metal film is formed on the surface of the processing substrate 50 at which the filling materials 57 and the principal semiconductor layer 52 are exposed. Then, unwanted portions are removed by etching, allowing the remaining portion of the thin metal film to form a first electrode 59 (FIG. 18b).

The first electrode 59 forms a Schottky junction with the principal semiconductor layer 52 and provides an ohmic contact to the filling material 57. The filling material 57 and the principal semiconductor layer 52 have conductivity types opposite to each other and a P-N junction formed therebetween.

Then, as shown in FIG. 18c, a metal film which provides an ohmic contact to the semiconductor substrate 51 is formed on the surface of the semiconductor substrate 51, so as to form a second electrode 60.

For the diode 5, applying a negative voltage to the second electrode 60 and a positive voltage to the first electrode 59 causes the Schottky junction between the first electrode 59 and the principal semiconductor layer 52 to be forward biased; thereby, allowing a current to flow from the first electrode 59 toward the second electrode 60.

At this time, the P-N junction between the filling material 57 and the principal semiconductor layer 52 is also forward biased. However, since the barrier of the P-N junction is higher than that of the Schottky junction, no current flows through the P-N junction or otherwise a trace amount of current may flow.

To the contrary to this, applying a positive voltage to the second electrode 60 and a negative voltage to the first electrode 59 will cause the Schottky junction between the first electrode 59 and the principal semiconductor layer 52 and the P-N junction between the filling material 57 and the principal semiconductor layer 52 to be reverse biased; thereby, allowing no current to flow therethrough.

Figure 19:
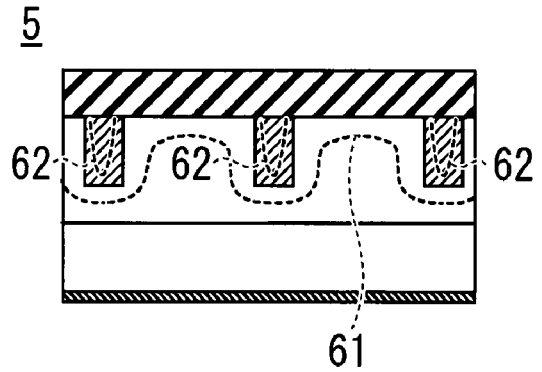
FIG. 19 is an explanatory view illustrating the state of a depletion layer in a diode according to the present invention.
Figure 20:
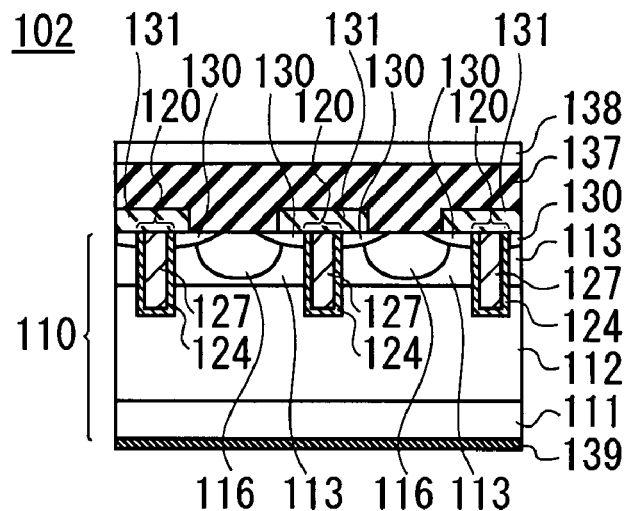
FIG. 20 is an explanatory view illustrating a prior-art transistor.
Figure 21:
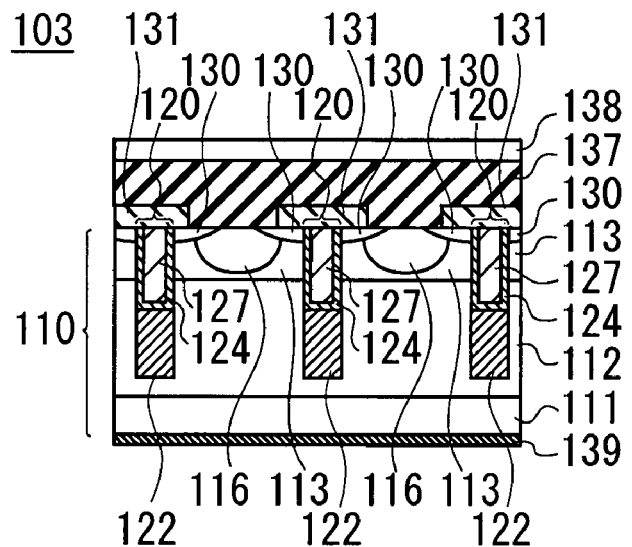
FIG. 21 is an explanatory view illustrating a transistor having a filling material.

At this stage, a depletion layer extends into the principal semiconductor layer 52 from both the Schottky junction and the P-N junction. Reference numeral 61 of FIG. 19 indicates the edge of a depletion layer that extends into the principal semiconductor layer 52 from the Schottky junction and the P-N junction. On the other hand, reference numeral 62 of FIG. 19 indicates the edge of a depletion layer that extends into the filling material 57 from the P-N junction.

For the diode 5, the width and concentration of the filling material 57, the intervals between the filling materials 57, and the concentration of the principal semiconductor layer 52 are optimized. This allows edges of the depletion layer in the principal semiconductor layer 52, the edges being laterally extended from the P-N junction, to contact each other when the filling material 57 is completely depleted.

As described above, in the diode 5 according to the present invention, the electric field that is established in the depletion layer extended in the principal semiconductor layer 52 has a constant strength in the direction of the depth.

The present invention has been described above in accordance with the embodiments of a transistor and diode. However, the invention is also widely applicable to a semiconductor device having a trench that is filled with an epitaxially grown semiconductor.

In the above examples, the first conductivity type is of N-type and the second conductivity type is of P-type. However, the invention also includes a transistor and diode in which the N-type and P-type are totally interchanged such that the first conductivity type is of P-type and the second conductivity type is of N-type.

As described above, the invention provides a transistor and diode which have a low conduction resistance and a high breakdown voltage.

What is claimed is:

1. A diode comprising:
    a semiconductor substrate having single crystal structure of first conductivity type;
    a principal semiconductor layer of a first conductivity type grown on a surface of said semiconductor substrate;
    a narrow trench formed in the principal semiconductor layer, the narrow trench having a bottom and four sidewalls which are each a {100} oriented surface of the principal semiconductor layer;
    a filling material having surfaces with same crystalline orientation as the surfaces of the principal semiconductor layer in contact with the filling material and being epitaxially grown on the bottom and four sidewalls of the narrow trench and doped with a dopant of a second conductivity type;
    a Schottky electrode in contact with the principal semiconductor layer and with a surface of the filling material, the Schottky electrode forming a Schottky junction with the principal semiconductor layer and forming an ohmic contact to the filling material; and
    an ohmic electrode formed on a back surface of the semiconductor substrate and forming ohmic contact to the semiconductor substrate.

2. The diode according to claim 1, wherein the Schottky junction and P-N junction between the filling material and the principal semiconductor layer are either both forward biased or both reverse biased when a voltage is applied to the Schottky electrode and the ohmic electrode.

3. The diode according to claim 2, wherein the diode comprises at least two filling materials according to claim 2; and
    a width and an impurity concentration of the filling material, and interval between the two adjacent filling materials and an impurity concentration of the principal semiconductor layer are set such that a depletion layer from a first filling material extends to a depletion layer from a second adjacent filling material when a voltage sufficient to completely deplete the filling material is applied.

* * * * *